United States Patent
Baek et al.

(10) Patent No.: US 11,309,621 B2
(45) Date of Patent: Apr. 19, 2022

(54) ANTENNA MODULE AND ELECTRONIC DEVICE INCLUDING THE SAME

(71) Applicant: Samsung Electronics Co., Ltd., Suwon-si (KR)

(72) Inventors: Kwanghyun Baek, Suwon-si (KR); Dohyuk Ha, Suwon-si (KR); Youngju Lee, Suwon-si (KR); Jungyub Lee, Suwon-si (KR); Juneseok Lee, Suwon-si (KR); Jinsu Heo, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 246 days.

(21) Appl. No.: 16/844,706

(22) Filed: Apr. 9, 2020

(65) Prior Publication Data

US 2020/0328500 A1 Oct. 15, 2020

(30) Foreign Application Priority Data

Apr. 12, 2019 (KR) .......... 10-2019-0043156

(51) Int. Cl.
*H05K 7/00* (2006.01)
*H01Q 1/24* (2006.01)
(Continued)

(52) U.S. Cl.
CPC .............. *H01Q 1/24* (2013.01); *H01Q 1/526* (2013.01); *H05K 1/144* (2013.01); *H05K 1/181* (2013.01);
(Continued)

(58) Field of Classification Search
CPC .......... H01Q 1/24; H01Q 1/526; H05K 1/144; H05K 1/181; H05K 2201/041;
(Continued)

(56) References Cited

U.S. PATENT DOCUMENTS

| 5,448,249 A | 9/1995 | Kushihi et al. |
| 8,648,454 B2 * | 2/2014 | Liu .................. H01L 27/14618 |
| | | 257/684 |

(Continued)

FOREIGN PATENT DOCUMENTS

| CN | 103000617 A | 3/2013 |
| EP | 3621154 A1 | 3/2020 |
| WO | 2018/210054 A1 | 11/2018 |

OTHER PUBLICATIONS

European Search Report dated Sep. 1, 2020 in connection with European Patent Application No. 20 16 9104, 21 pages.

*Primary Examiner* — Binh B Tran

(57) ABSTRACT

The present disclosure relates to a communication method and system for converging a $5^{th}$-Generation (5G) communication system for supporting higher data rates beyond a $4^{th}$-Generation (4G) system with a technology for Internet of Things (IoT). The present disclosure may be applied to intelligent services based on the 5G communication technology and the IoT-related technology, such as smart home, smart building, smart city, smart car, connected car, health care, digital education, smart retail, security and safety services. An antenna module includes a first printed circuit board (PCB) stacked at least one layer, and a second PCB disposed on an upper surface of the first PCB and stacked at least one layer. The antenna module further includes a wireless communication chip disposed on an upper surface of the second PCB and controlling an electrical signal for a radio frequency, a first structure disposed on the upper surface of the first PCB and surrounding the upper surface of the first PCB, a first antenna disposed on an inner surface of the first structure to face the first PCB, and a feed line electrically connecting the first antenna and the wireless communication chip.

20 Claims, 4 Drawing Sheets

(51) Int. Cl.
*H01Q 1/52* (2006.01)
*H05K 1/14* (2006.01)
*H05K 1/18* (2006.01)

(52) U.S. Cl.
CPC .......... *H05K 2201/041* (2013.01); *H05K 2201/10098* (2013.01); *H05K 2201/10371* (2013.01); *H05K 2201/10734* (2013.01)

(58) Field of Classification Search
CPC .......... H05K 2201/10098; H05K 2201/10371; H05K 2201/10734; H05K 1/14; H05K 1/141; H05K 1/145
USPC .......................................................... 361/729
See application file for complete search history.

(56) References Cited

U.S. PATENT DOCUMENTS

| | | | |
|---|---|---|---|
| 9,985,346 B2 | 5/2018 | Baks et al. | |
| 2009/0322643 A1* | 12/2009 | Choudhury | H01Q 1/526 343/851 |
| 2014/0145884 A1* | 5/2014 | Dang | H01Q 1/2283 343/700 MS |
| 2016/0049723 A1 | 2/2016 | Baks et al. | |
| 2018/0151518 A1 | 5/2018 | Shen et al. | |
| 2018/0159203 A1 | 6/2018 | Baks et al. | |
| 2020/0161766 A1 | 5/2020 | Liu et al. | |

\* cited by examiner

ANTENNA MODULE AND ELECTRONIC DEVICE INCLUDING THE SAME

CROSS-REFERENCE TO RELATED APPLICATION

This application is based on and claims priority under 35 U.S.C. 119 to Korean Patent Application No. 10-2019-0043156, filed on Apr. 12, 2019, in the Korean Intellectual Property Office, the disclosures of which are herein incorporated by reference in their entireties.

BACKGROUND

1. Field

The disclosure relates to an antenna module and an electronic device including the same.

2. Description of Related Art

To meet the demand for wireless data traffic having increased since deployment of 4G communication systems, efforts have been made to develop an improved 5G or pre-5G communication system. Therefore, the 5G or pre-5G communication system is also called a 'Beyond 4G Network' or a 'Post LTE System'. The 5G communication system is considered to be implemented in higher frequency (mmWave) bands, e.g., 60 GHz bands, so as to accomplish higher data rates. To decrease propagation loss of the radio waves and increase the transmission distance, the beamforming, massive multiple-input multiple-output (MIMO), Full Dimensional MIMO (FD-MIMO), array antenna, an analog beam forming, large scale antenna techniques are discussed in 5G communication systems. In addition, in 5G communication systems, development for system network improvement is under way based on advanced small cells, cloud Radio Access Networks (RANs), ultra-dense networks, device-to-device (D2D) communication, wireless backhaul, moving network, cooperative communication, Coordinated Multi-Points (CoMP), reception-end interference cancellation and the like. In the 5G system, Hybrid FSK and QAM Modulation (FQAM) and sliding window superposition coding (SWSC) as an advanced coding modulation (ACM), and filter bank multi carrier (FBMC), non-orthogonal multiple access (NOMA), and sparse code multiple access (SCMA) as an advanced access technology have been developed.

The Internet, which is a human centered connectivity network where humans generate and consume information, is now evolving to the Internet of Things (IoT) where distributed entities, such as things, exchange and process information without human intervention. The Internet of Everything (IoE), which is a combination of the IoT technology and the Big Data processing technology through connection with a cloud server, has emerged. As technology elements, such as "sensing technology", "wired/wireless communication and network infrastructure", "service interface technology", and "Security technology" have been demanded for IoT implementation, a sensor network, a Machine-to-Machine (M2M) communication, Machine Type Communication (MTC), and so forth have been recently researched. Such an IoT environment may provide intelligent Internet technology services that create a new value to human life by collecting and analyzing data generated among connected things. IoT may be applied to a variety of fields including smart home, smart building, smart city, smart car or connected cars, smart grid, health care, smart appliances and advanced medical services through convergence and combination between existing Information Technology (IT) and various industrial applications.

In line with this, various attempts have been made to apply 5G communication systems to IoT networks. For example, technologies such as a sensor network, Machine Type Communication (MTC), and Machine-to-Machine (M2M) communication may be implemented by beamforming, MIMO, and array antennas. Application of a cloud Radio Access Network (RAN) as the above-described Big Data processing technology may also be considered to be as an example of convergence between the 5G technology and the IoT technology.

SUMMARY

According to the disclosure, an antenna module may include a first printed circuit board (PCB) stacked at least one layer, a second PCB disposed on an upper surface of the first PCB and stacked at least one layer, a wireless communication chip disposed on an upper surface of the second PCB and controlling an electrical signal for a radio frequency, a first structure disposed on the upper surface of the first PCB and surrounding the upper surface of the first PCB, a first antenna disposed on an inner surface of the first structure to face the first PCB, and a feed line electrically connecting the first antenna and the wireless communication chip.

According to the disclosure, an antenna module may include a first printed circuit board (PCB) stacked at least one layer, a second PCB disposed on an upper surface of the first PCB and stacked at least one layer, a wireless communication chip disposed on an upper surface of the second PCB and controlling an electrical signal for a radio frequency, a first structure disposed on the upper surface of the first PCB and surrounding the upper surface of the first PCB, a first antenna disposed on an inner surface of the first structure to face the first PCB, a second antenna disposed on the inner surface of the first structure to face the first PCB, a third antenna disposed on the inner surface of the first structure to face the first PCB, a fourth antenna disposed on the inner surface of the first structure to face the first PCB, a first feed line electrically connecting the first antenna and the wireless communication chip, a second feed line electrically connecting the second antenna and the wireless communication chip, a third feed line electrically connecting the third antenna and the wireless communication chip, and a fourth feed line electrically connecting the fourth antenna and the wireless communication chip.

According to the disclosure, an electronic device may include an antenna module that may include a first printed circuit board (PCB) stacked at least one layer, a second PCB disposed on an upper surface of the first PCB and stacked at least one layer, a wireless communication chip disposed on an upper surface of the second PCB and controlling an electrical signal for a radio frequency, a first structure disposed on the upper surface of the first PCB and surrounding the upper surface of the first PCB, a first antenna disposed on an inner surface of the first structure to face the first PCB, and a feed line electrically connecting the first antenna and the wireless communication chip.

According to embodiments of the disclosure, the length of a feed path between the antenna and the wireless communication chip is reduced, so that a path loss in the antenna module may be reduced even in a super-high frequency band. In addition, the performance of the antenna module may be improved by effectively dissipating heat generated from the antenna module.

Before undertaking the DETAILED DESCRIPTION below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, such a device may be implemented in hardware, firmware or software, or some combination of at least two of the same. It should be noted that the functionality associated with any particular controller may be centralized or distributed, whether locally or remotely.

Moreover, various functions described below can be implemented or supported by one or more computer programs, each of which is formed from computer readable program code and embodied in a computer readable medium. The terms "application" and "program" refer to one or more computer programs, software components, sets of instructions, procedures, functions, objects, classes, instances, related data, or a portion thereof adapted for implementation in a suitable computer readable program code. The phrase "computer readable program code" includes any type of computer code, including source code, object code, and executable code. The phrase "computer readable medium" includes any type of medium capable of being accessed by a computer, such as read only memory (ROM), random access memory (RAM), a hard disk drive, a compact disc (CD), a digital video disc (DVD), or any other type of memory. A "non-transitory" computer readable medium excludes wired, wireless, optical, or other communication links that transport transitory electrical or other signals. A non-transitory computer readable medium includes media where data can be permanently stored and media where data can be stored and later overwritten, such as a rewritable optical disc or an erasable memory device.

Definitions for certain words and phrases are provided throughout this patent document. Those of ordinary skill in the art should understand that in many, if not most instances, such definitions apply to prior, as well as future uses of such defined words and phrases.

BRIEF DESCRIPTION OF THE DRAWINGS

The above and other aspects, features and advantages of certain embodiments of the disclosure will be more apparent from the following detailed description, taken in conjunction with the accompanying drawings.

DETAILED DESCRIPTION

Figure 1:
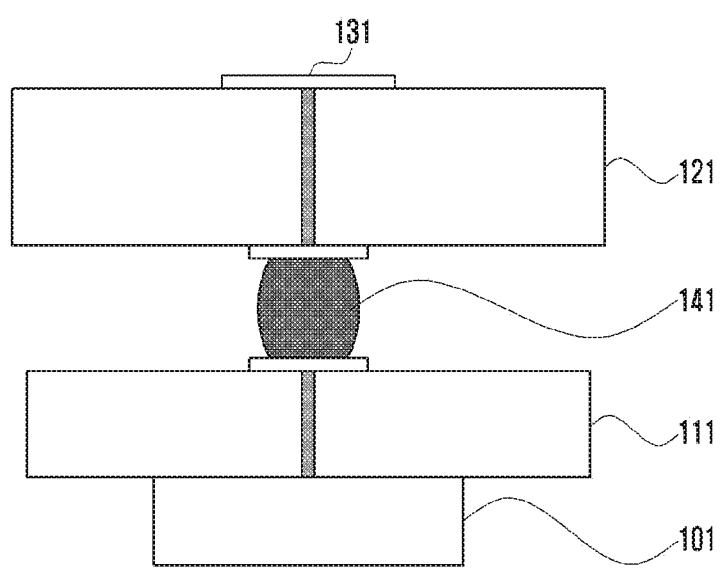
FIG. 1 is a diagram illustrating a typical antenna module structure.

FIGS. 1 through 4, discussed below, and the various embodiments used to describe the principles of the present disclosure in this patent document are by way of illustration only and should not be construed in any way to limit the scope of the disclosure. Those skilled in the art will understand that the principles of the present disclosure may be implemented in any suitably arranged system or device.

Now, embodiments of the disclosure will be described in detail with reference to the accompanying drawings. In the following description of embodiments, descriptions of techniques that are well known in the art and not directly related to the disclosure are omitted. This is to clearly convey the subject matter of the disclosure by omitting any unnecessary explanation.

For the same reason, some elements in the drawings are exaggerated, omitted, or schematically illustrated. Also, the size of each element does not entirely reflect the actual size. In the drawings, the same or corresponding elements are denoted by the same reference numerals.

The advantages and features of the disclosure and the manner of achieving them will become apparent with reference to the embodiments described in detail below and with reference to the accompanying drawings. The disclosure may, however, be embodied in many different forms and should not be construed as being limited to the embodiments set forth herein. Rather, these embodiments are provided so that the disclosure will be thorough and complete and will fully convey the scope of the disclosure to those skilled in the art. The disclosure is only defined by the scope of claims.

It will be understood that each block of the flowchart illustrations, and combinations of blocks in the flowchart illustrations, may be implemented by computer program instructions. These computer program instructions may be provided to a processor of a general purpose computer, special purpose computer, or other programmable data processing apparatus to produce a machine, such that the instructions, which are executed via the processor of the computer or other programmable data processing apparatus, generate means for implementing the functions specified in the flowchart block or blocks. These computer program instructions may also be stored in a computer usable or computer-readable memory that may direct a computer or other programmable data processing apparatus to function in a particular manner, such that the instructions stored in the computer usable or computer-readable memory produce an article of manufacture including instruction means that implement the function specified in the flowchart block or blocks. The computer program instructions may also be loaded onto a computer or other programmable data processing apparatus to cause a series of operational steps to be performed on the computer or other programmable apparatus to produce a computer implemented process such that the instructions that are executed on the computer or other programmable apparatus provide steps for implementing the functions specified in the flowchart block or blocks.

In addition, each block of the flowchart illustrations may represent a module, segment, or portion of code, which comprises one or more executable instructions for implementing the specified logical function(s). It should also be noted that in some alternative implementations, the functions noted in the blocks may occur out of the order. For example, two blocks shown in succession may in fact be executed substantially concurrently or the blocks may sometimes be executed in the reverse order, depending upon the functionality involved.

The term "unit", as used herein, refers to a software or hardware component or device, such as a field programmable gate array (FPGA) or application specific integrated circuit (ASIC), which performs certain tasks. A unit may be configured to reside on an addressable storage medium and configured to execute on one or more processors. Thus, a module or unit may include, by way of example, components, such as software components, object-oriented software components, class components and task components, processes, functions, attributes, procedures, subroutines, segments of program code, drivers, firmware, microcode, circuitry, data, databases, data structures, tables, arrays, and variables. The functionality provided for in the components and units may be combined into fewer components and units or further separated into additional components and modules. In addition, the components and units may be implemented to operate one or more central processing units (CPUs) in a device or a secure multimedia card. In embodiments, a certain unit may include one or more processors.

FIG. 1 is a diagram illustrating a typical antenna module structure.

Typically, an antenna module may include a first printed circuit board (PCB) 111 stacked at least one layer, and a second PCB 121 stacked at least one layer. In general, the first PCB 111 and the second PCB 121 may be connected with each other through a ball grid array (BGA) 141 interposed therebetween.

In the typical antenna module, a wireless communication chip 101 may be disposed on a lower surface of the first PCB 111, and an antenna 131 for radiating radio waves may be disposed on an upper surface of the second PCB 121. The second PCB 121 may be a main PCB of the antenna module, and the first PCB 111 may be a sub PCB of the antenna module. According to various embodiments, the precision of the second PCB 121 may be higher than that of the first printed circuit board 111. The first and second PCBs 111 and 121 may be different from each other in pattern precision or density.

The wireless communication chip 101 may control an electrical signal for generating a radio frequency. Specifically, the wireless communication chip 101 may generate a radio frequency by receiving various electrical signals (e.g., local frequency, intermediate frequency component, and the like) from the second PCB 121, and transmit the generated radio frequency to the antenna 131. For example, the wireless communication chip 101 may control a phase shifter and the like disposed therein to enable the antenna 131 to perform beamforming.

Figure 2:
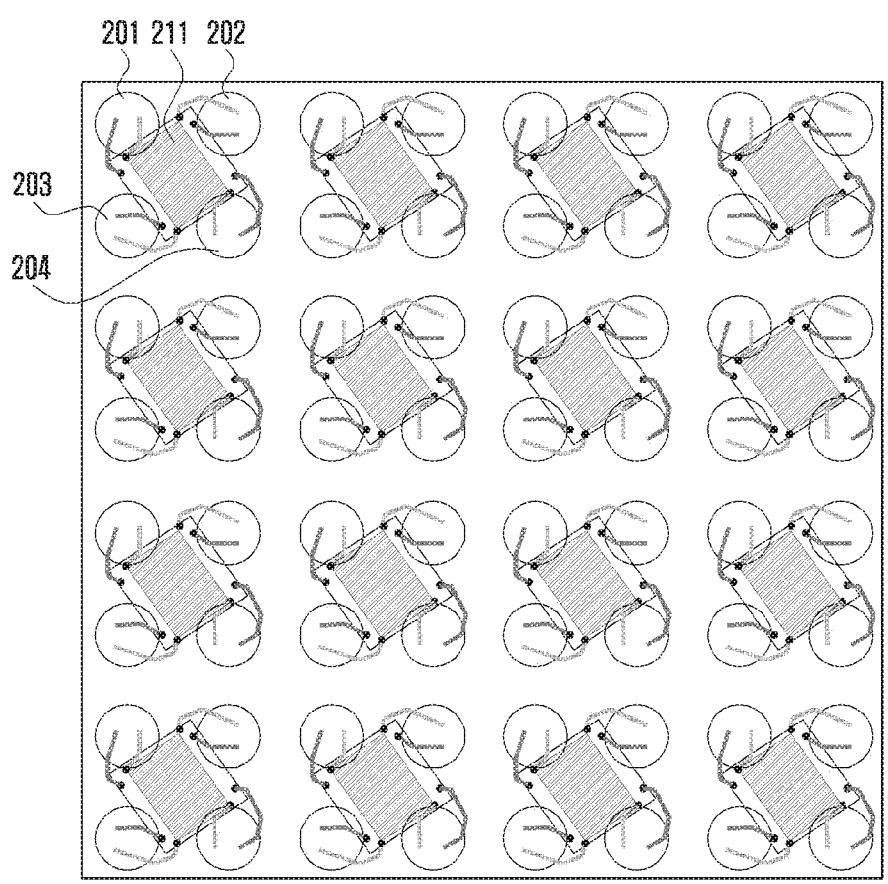
FIG. 2 is a diagram illustrating an antenna module structure in an electronic device according to an embodiment of the disclosure.

FIG. 2 is a diagram illustrating an antenna module structure in an electronic device according to an embodiment of the disclosure.

According to an embodiment, the electronic device may include at least one antenna and at least one wireless communication chip. FIG. 2 exemplarily shows a structure in which sixty-four antennas and sixteen wireless communication chips are included in one electronic device according to an embodiment of the disclosure. In case of FIG. 2, a single wireless communication chip is capable of controlling four antennas. That is, in the FIG. 2 case, one wireless communication chip controls four radio frequency (RF) chains.

As described above, it is desirable to reduce the number of RF chains controlled by one wireless communication chip as a frequency band used for communication increases. This is because as the number of RF chains increases, an antenna gain loss due to feed lines may increase. Accordingly, compared to typical techniques (e.g., case where one wireless communication chip controls sixteen antennas), the disclosure provides a technique of improving an antenna gain value by allowing one wireless communication chip to control four antennas.

According to an embodiment, a wireless communication chip 211 may be electrically connected to a first antenna 201, a second antenna 202, a third antenna 203, and a fourth antenna 204. In various embodiments, the wireless communication chip 211 may supply an electrical signal for generating an RF frequency to each of the antennas 201, 202, 203, and 204 through a feed line corresponding to each antenna.

In FIG. 2, for simplicity of illustration, reference numerals 211, 201, 202, 203, and 204 are used for indicating only one wireless communication chip and corresponding four antennas. A description about components indicated by reference numerals are also applied to the other components not indicated by reference numerals. In addition, the embodiment shown in FIG. 2 is an example only and should not be construed as a limitation of the disclosure.

Figure 3:
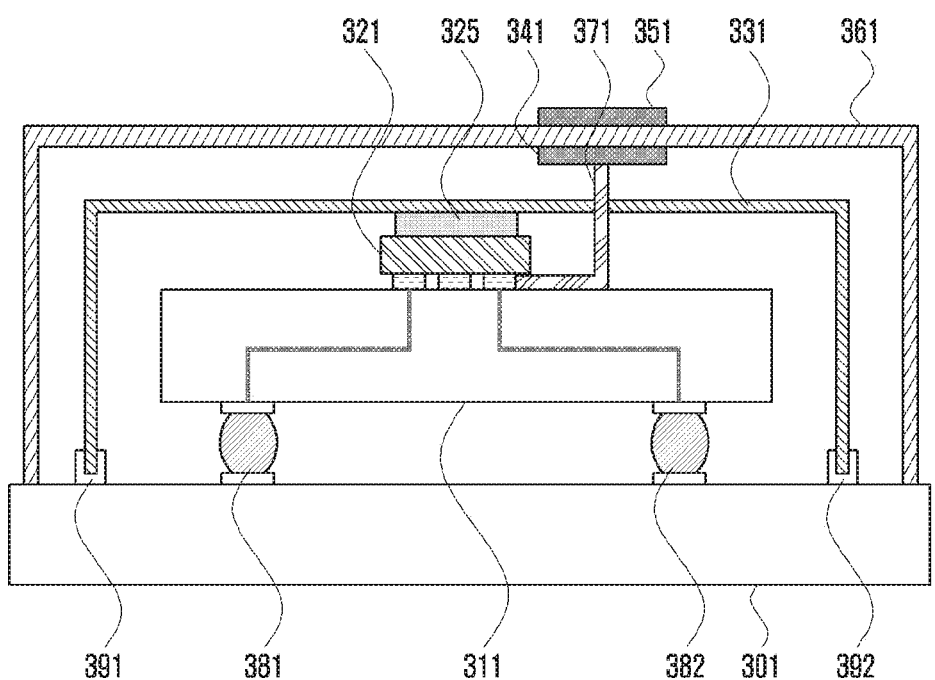
FIG. 3 is a diagram illustrating an antenna module structure according to an embodiment of the disclosure.

FIG. 3 is a diagram illustrating an antenna module structure according to an embodiment of the disclosure.

According to an embodiment, an antenna module may include a first printed circuit board (PCB) 301 stacked at least one layer, and a second PCB 311 disposed above an upper surface of the first PCB 301 and stacked at least one layer. The antenna module may further include a wireless communication chip 321 disposed above an upper surface of the second PCB 311 to control an electrical signal for a radio frequency, a first structure 361 disposed above the upper surface of the first PCB 301 to surround the upper surface of the first PCB 301, a first antenna 341 disposed on an inner surface of the first structure 361 to face the first PCB 301, and a feed line 371 electrically connecting the first antenna 341 and the wireless communication chip 321.

According to an embodiment, the first PCB 301 and the second PCB 311 may be combined with each other through a ball grid array (BGA) or a land grid array (LGA). The BGAs 381 and 382 interposed between the first PCB 301 and the second PCB 311 may offer mechanical and electrical connections between the first PCB 301 and the second PCB 311 while maintaining a uniform space between the first PCB 301 and the second PCB 311.

According to an embodiment, the first PCB 301 may be a main PCB of the antenna module, and may transmit a frequency signal for generating power or a radio frequency to the wireless communication chip 321 through the second PCB 311. For example, the first PCB 301 may transmit a local frequency or an intermediate frequency for generating a radio frequency to the wireless communication chip 321.

According to an embodiment, the antenna module may further include a second antenna 351 disposed on an outer surface of the first structure 361. That is, the second antenna 351 may be disposed on a surface opposite to the inner surface of the first structure 361 where the first antenna 341 is disposed.

According to an embodiment, the first antenna 341 and the second antenna 351 may be spaced apart from each other at a particular interval determined by the first structure 361. The particular interval between the first and second antennas 341 and 351 may be determined based on a wavelength of radio waves to be radiated through the antenna module.

According to an embodiment, the first structure 361 may be formed of a dielectric material. According to various embodiments, the gain value of the antenna module may be improved by adjusting the dielectric constant and thickness (i.e., the aforementioned interval between the first and second antennas) of the first structure 361.

According to an embodiment, the antenna module may further include a second structure 331 disposed above the upper surface of the second PCB 311 to surround the wireless communication chip 321 and the second PCB 311. The second structure 331 may be formed of or contain a metallic material for blocking electromagnetic waves. For example, the second structure 331 may be what is called a shield can. The second structure 331 may operate as a ground layer for the first antenna 341 and/or the second antenna 351.

According to an embodiment, the second structure 331 may be connected to the upper surface of the first PCB 301 through one or more connectors 391 and 392. For example, the one or more connectors 391 and 392 may be formed of pogo pins or any other equivalent.

According to an embodiment, the feed line 371 may penetrate the second structure 331 and directly connect the wireless communication chip 321 and the first antenna 341. According to another embodiment, the feed line 371 may be spaced apart from the first antenna 341 by a certain distance. That is, a capacitive coupling technique may be used as a power feeding method for the antenna. In this case, a separation distance between the antenna and a feeding pad may be determined based on the radio waves to be radiated through the antenna or the dielectric constant of a space between the antenna and the feeding pad.

According to an embodiment, a thermal interface material (TIM) 325 may be disposed between the second structure 331 and the wireless communication chip 321. One surface of the TIM 325 may be combined with the second structure 331, and the other surface of the TIM 325 may be combined with the wireless communication chip 321.

According to an embodiment, heat generated at the wireless communication chip 321 may be transferred to the second structure 331 through the TIM 325 and thereby dissipated to the outside of the antenna module. In addition, although not shown in FIG. 3, a heat sink or a radiation fin may be combined with the second structure 331 to further improve heat dissipation performance of the antenna module.

Figure 4:
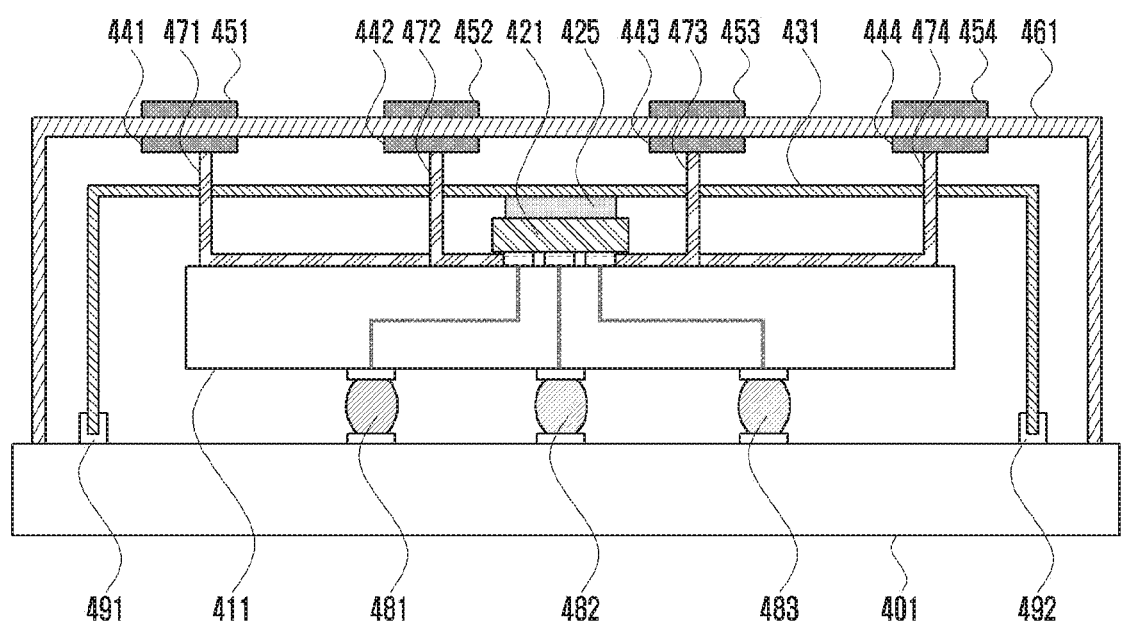
FIG. 4 is a diagram illustrating an antenna module structure including four RF changes according to an embodiment of the disclosure.

FIG. 4 is a diagram illustrating an antenna module structure including four RF changes according to an embodiment of the disclosure.

According to an embodiment, an antenna module may include a first PCB 401 stacked at least one layer, and a second PCB 411 disposed above an upper surface of the first PCB 401 and stacked at least one layer. The antenna module may further include a wireless communication chip 421 disposed above an upper surface of the second PCB 411 to control an electrical signal for a radio frequency, and a first structure 461 disposed above the upper surface of the first PCB 401 to surround the upper surface of the first PCB 401. In addition, the antenna module may include a first antenna 441, a second antenna 442, a third antenna 443, and a fourth antenna 444 each disposed on an inner surface of the first structure 461 to face the first PCB 401. Also, the antenna module may include a first feed line 471 electrically connecting the first antenna 441 and the wireless communication chip 421, a second feed line 472 electrically connecting the second antenna 442 and the wireless communication chip 421, a third feed line 473 electrically connecting the third antenna 443 and the wireless communication chip 421, and a fourth feed line 474 electrically connecting the fourth antenna 444 and the wireless communication chip 421.

According to various embodiments, the first antenna 441, the second antenna 442, the third antenna 443, and the fourth antenna 444 may be spaced apart from each other at predetermined intervals. For example, the first to fourth antennas 441, 442, 443, and 444 may be disposed at regular or irregular intervals.

According to an embodiment, the first PCB 401 and the second PCB 411 may be combined with each other through a ball grid array (BGA) or a land grid array (LGA). The BGAs 481, 482, and 483 interposed between the first PCB 401 and the second PCB 411 may offer mechanical and electrical connections between the first PCB 401 and the second PCB 411 while maintaining a uniform space between the first PCB 401 and the second PCB 411.

According to an embodiment, the first PCB 401 may be a main PCB of the antenna module, and may transmit a frequency signal for generating power or a radio frequency to the wireless communication chip 421 through the second PCB 411. For example, the first PCB 401 may transmit a local frequency or an intermediate frequency for generating a radio frequency to the wireless communication chip 421.

According to an embodiment, the antenna module may further include a fifth antenna 451, a sixth antenna 452, a seventh antenna 453, and an eighth antenna 454 each disposed on an outer surface of the first structure 461. That is, the fifth antenna 451 may be disposed on a surface opposite to the inner surface of the first structure 461 where the first antenna 441 is disposed, and the sixth antenna 452 may be disposed on a surface opposite to the inner surface of the first structure 461 where the second antenna 442 is disposed. Similarly, the seventh antenna 453 may be disposed on a surface opposite to the inner surface of the first structure 461 where the third antenna 443 is disposed, and the eighth antenna 454 may be disposed on a surface opposite to the inner surface of the first structure 461 where the fourth antenna 444 is disposed.

According to an embodiment, the first antenna 441 and the fifth antenna 451 may be spaced apart from each other at a particular interval determined by the first structure 461. The particular interval between the first and fifth antennas 441 and 451 may be determined based on a wavelength of radio waves to be radiated through the antenna module. A particular interval between the second and sixth antennas 442 and 452, a particular interval between the third and seventh antennas 443 and 453, and a particular interval between the fourth and eighth antennas 444 and 454 may be determined similarly.

According to an embodiment, the first structure 461 may be formed of a dielectric material. According to various embodiments, the gain value of the antenna module may be improved by adjusting the dielectric constant and thickness (i.e., the aforementioned interval between the first and fifth antennas) of the first structure 461.

According to an embodiment, the antenna module may further include a second structure 431 disposed above the upper surface of the second PCB 411 to surround the wireless communication chip 421 and the second PCB 411. The second structure 431 may be formed of or contain a metallic material for blocking electromagnetic waves. For example, the second structure 431 may be what is called a shield can. The second structure 431 may operate as a ground layer for the antennas of the antenna module.

According to an embodiment, the second structure 431 may be connected to the upper surface of the first PCB 401 through one or more connectors 491 and 492. For example, the one or more connectors 491 and 492 may be formed of pogo pins or any other equivalent.

According to an embodiment, the first feed line 471 may penetrate the second structure 431 and directly connect the wireless communication chip 421 and the first antenna 441. Similarly, the second feed line 472 may penetrate the second structure 431 and directly connect the wireless communication chip 421 and the second antenna 442, the third feed line 473 may penetrate the second structure 431 and directly connect the wireless communication chip 421 and the third antenna 443, and the fourth feed line 474 may penetrate the second structure 431 and directly connect the wireless communication chip 421 and the fourth antenna 444. According to another embodiment, each of the feed lines 471, 472, 473, and 474 may be spaced apart from each of the antennas 441, 442, 443, and 444 by a certain distance. That is, a capacitive coupling technique may be used as a power feeding method for such antennas. In this case, a separation distance between each antenna and a feeding pad of each feed line may be determined based on the radio waves to be radiated through the antenna or the dielectric constant of a space between the antenna and the feeding pad.

According to an embodiment, a thermal interface material (TIM) 425 may be disposed between the second structure 431 and the wireless communication chip 421. One surface of the TIM 425 may be combined with the second structure 431, and the other surface of the TIM 425 may be combined with the wireless communication chip 421.

According to an embodiment, heat generated at the wireless communication chip 421 may be transferred to the second structure 431 through the TIM 425 and thereby dissipated to the outside of the antenna module. In addition, although not shown in FIG. 4, a heat sink or a radiation fin may be combined with the second structure 431 to further improve heat dissipation performance of the antenna module.

The antenna module structures shown in FIGS. 3 and 4 are examples only and should not be construed as a limitation of the disclosure. That is, the antenna module structures shown in FIGS. 3 and 4 may be modified at least in part within a normal technical level.

According to an embodiment, an antenna module may include a first printed circuit board (PCB) stacked at least one layer; a second PCB disposed above an upper surface of the first PCB and stacked at least one layer; a wireless communication chip disposed above an upper surface of the second PCB and controlling an electrical signal for a radio frequency; a first structure disposed above the upper surface of the first PCB and surrounding the upper surface of the first PCB; a first antenna disposed on an inner surface of the first structure to face the first PCB; and a feed line electrically connecting the first antenna and the wireless communication chip.

According to an embodiment, the antenna module may further include a second antenna disposed on an outer surface of the first structure, and the second antenna may be disposed on a surface opposite to the inner surface of the first structure where the first antenna is disposed.

According to an embodiment, the first PCB and the second PCB may be combined with each other through a ball grid array (BGA), and the first PCB may transmit a frequency signal for generating power or a radio frequency to the wireless communication chip through the second PCB.

According to an embodiment, the antenna module may further include a second structure disposed above the upper surface of the second PCB and surrounding the wireless communication chip and the second PCB, and the second structure may be formed of or contains a metallic material for blocking electromagnetic waves.

According to an embodiment, the second structure may be connected to the upper surface of the first PCB through one or more connectors, and the second structure may operate as a ground layer for the first antenna.

According to an embodiment, the antenna module may further include a thermal interface material (TIM) disposed between and combined with the second structure and the wireless communication chip.

According to an embodiment, an antenna module may include a first printed circuit board (PCB) stacked at least one layer; a second PCB disposed above an upper surface of the first PCB and stacked at least one layer; a wireless communication chip disposed above an upper surface of the second PCB and controlling an electrical signal for a radio frequency; a first structure disposed above the upper surface of the first PCB and surrounding the upper surface of the first PCB; a first antenna disposed on an inner surface of the first structure to face the first PCB; a second antenna disposed on the inner surface of the first structure to face the first PCB; a third antenna disposed on the inner surface of the first structure to face the first PCB; a fourth antenna disposed on the inner surface of the first structure to face the first PCB; a first feed line electrically connecting the first antenna and the wireless communication chip; a second feed line electrically connecting the second antenna and the wireless communication chip; a third feed line electrically connecting the third antenna and the wireless communication chip; and a fourth feed line electrically connecting the fourth antenna and the wireless communication chip.

According to an embodiment, the antenna module may further include a fifth antenna disposed on an outer surface of the first structure; a sixth antenna disposed on the outer surface of the first structure; a seventh antenna disposed on the outer surface of the first structure; and an eighth antenna disposed on the outer surface of the first structure, wherein the fifth antenna may be disposed on a surface opposite to the inner surface of the first structure where the first antenna is disposed, the sixth antenna may be disposed on a surface opposite to the inner surface of the first structure where the second antenna is disposed, the seventh antenna may be disposed on a surface opposite to the inner surface of the first structure where the third antenna is disposed, and the eighth antenna may be disposed on a surface opposite to the inner surface of the first structure where the fourth antenna is disposed.

According to an embodiment, the first PCB and the second PCB may be combined with each other through a ball grid array (BGA), and the first PCB may transmit a frequency signal for generating power or a radio frequency to the wireless communication chip through the second PCB.

According to an embodiment, the antenna module may further include a second structure disposed above the upper surface of the second PCB and surrounding the wireless communication chip and the second PCB, and the second structure may be formed of or contains a metallic material for blocking electromagnetic waves.

According to an embodiment, the second structure may be connected to the upper surface of the first PCB through one or more connectors, and the second structure may operate as a ground layer for the first antenna, the second antenna, the third antenna, and the fourth antenna.

According to an embodiment, the antenna module may further include a thermal interface material (TIM) disposed between and combined with the second structure and the wireless communication chip.

According to an embodiment, an electronic device may include an antenna module that may include a first printed circuit board (PCB) stacked at least one layer; a second PCB disposed above an upper surface of the first PCB and stacked at least one layer; a wireless communication chip disposed above an upper surface of the second PCB and controlling an electrical signal for a radio frequency; a first structure disposed above the upper surface of the first PCB and surrounding the upper surface of the first PCB; a first antenna disposed on an inner surface of the first structure to face the first PCB; and a feed line electrically connecting the first antenna and the wireless communication chip.

According to an embodiment, the antenna module may further include a second antenna disposed on an outer surface of the first structure, and the second antenna may be disposed on a surface opposite to the inner surface of the first structure where the first antenna is disposed.

According to an embodiment, the first PCB and the second PCB may be combined with each other through a ball grid array (BGA), and the first PCB may transmit a frequency signal for generating power or a radio frequency to the wireless communication chip through the second PCB.

According to an embodiment, the antenna module may further include a second structure disposed above the upper surface of the second PCB and surrounding the wireless communication chip and the second PCB, and the second structure may be formed of or contains a metallic material for blocking electromagnetic waves.

According to an embodiment, the second structure may be connected to the upper surface of the first PCB through one or more connectors, and the second structure may operate as a ground layer for the first antenna.

According to an embodiment, the antenna module may further include a thermal interface material (TIM) disposed between and combined with the second structure and the wireless communication chip.

While the disclosure has been particularly shown and described with reference to various embodiments thereof, it will be understood by those skilled in the art that various changes in form and details may be made therein without departing from the scope of the subject matter as defined by the appended claims.

Although the present disclosure has been described with various embodiments, various changes and modifications may be suggested to one skilled in the art. It is intended that the present disclosure encompass such changes and modifications as fall within the scope of the appended claims.

What is claimed is:

1. An antenna module comprising:
a first printed circuit board (PCB) stacked at least one layer;
a second PCB disposed on an upper surface of the first PCB and stacked at least one layer;
a wireless communication chip disposed on an upper surface of the second PCB and configured to control an electrical signal for a radio frequency;
a first structure disposed on the upper surface of the first PCB and surrounding the upper surface of the first PCB;
a first antenna disposed on an inner surface of the first structure to face the first PCB; and
a feed line electrically connecting the first antenna and the wireless communication chip.

2. The antenna module of claim 1, further comprising:
a second antenna disposed on an outer surface of the first structure,
wherein the second antenna is disposed on a surface opposite to the inner surface of the first structure where the first antenna is disposed.

3. The antenna module of claim 2, wherein the first antenna is spaced apart from the second antenna at an interval determined by the first structure.

4. The antenna module of claim 1, wherein:
the first PCB and the second PCB are combined through a ball grid array (BGA), and
the first PCB transmits a frequency signal for generating power or a radio frequency to the wireless communication chip through the second PCB.

5. The antenna module of claim 1, further comprising:
a second structure disposed on the upper surface of the first PCB and surrounding the wireless communication chip and the second PCB,
wherein the second structure is formed of or contains a metallic material for blocking electromagnetic waves.

6. The antenna module of claim 5, wherein:
the second structure is connected to the upper surface of the first PCB through a connector, and
the second structure operates as a ground layer for the first antenna.

7. The antenna module of claim 5, further comprising:
a thermal interface material (TIM) disposed on the inner surface of the second structure facing the wireless communication chip and coupled with the wireless communication chip.

8. An antenna module comprising:
a first printed circuit board (PCB) stacked at least one layer;
a second PCB disposed above an upper surface of the first PCB and stacked at least one layer;
a wireless communication chip disposed above an upper surface of the second PCB and configured to control an electrical signal for a radio frequency;
a first structure disposed above the upper surface of the first PCB and surrounding the upper surface of the first PCB;
a first antenna disposed on an inner surface of the first structure to face the first PCB;
a second antenna disposed on the inner surface of the first structure to face the first PCB;
a third antenna disposed on the inner surface of the first structure to face the first PCB;
a fourth antenna disposed on the inner surface of the first structure to face the first PCB;
a first feed line electrically connecting the first antenna and the wireless communication chip;
a second feed line electrically connecting the second antenna and the wireless communication chip;
a third feed line electrically connecting the third antenna and the wireless communication chip; and
a fourth feed line electrically connecting the fourth antenna and the wireless communication chip.

9. The antenna module of claim 8, further comprising:
a fifth antenna disposed on an outer surface of the first structure opposite to the inner surface of the first structure where the first antenna is disposed;
a sixth antenna disposed on the outer surface of the first structure opposite to the inner surface of the first structure where the second antenna is disposed;
a seventh antenna disposed on the outer surface of the first structure opposite to the inner surface of the first structure where the third antenna is disposed; and an eighth antenna disposed on the outer surface of the first structure opposite to the inner surface of the first structure where the fourth antenna is disposed.

10. The antenna module of claim 8, wherein:
the first PCB and the second PCB are combined through a ball grid array (BGA), and
the first PCB transmits a frequency signal for generating power or a radio frequency to the wireless communication chip through the second PCB.

11. The antenna module of claim 8, further comprising:
a second structure disposed on the upper surface of the first PCB and surrounding the wireless communication chip and the second PCB,
wherein the second structure is formed of or contains a metallic material for blocking electromagnetic waves.

12. The antenna module of claim 11, wherein:
the second structure is connected to the upper surface of the first PCB through a connector, and
the second structure operates as a ground layer for the first antenna, the second antenna, the third antenna, and the fourth antenna.

13. The antenna module of claim 11, further comprising:
a thermal interface material (TIM) disposed on the inner surface of the second structure facing the wireless communication chip and coupled with the wireless communication chip.

14. An electronic device comprising:
an antenna module including:
  a first printed circuit board (PCB) stacked at least one layer;
  a second PCB disposed on an upper surface of the first PCB and stacked at least one layer;
  a wireless communication chip disposed on an upper surface of the second PCB and configured to control an electrical signal for a radio frequency;
  a first structure disposed on the upper surface of the first PCB and surrounding the upper surface of the first PCB;
  a first antenna disposed on an inner surface of the first structure to face the first PCB; and
  a feed line electrically connecting the first antenna and the wireless communication chip.

15. The electronic device of claim 14, wherein:
the antenna module further includes a second antenna disposed on an outer surface of the first structure, and
the second antenna is disposed on a surface opposite to the inner surface of the first structure where the first antenna is disposed.

16. The electronic device of claim 15, wherein the first antenna is spaced apart from the second antenna at an interval determined by the first structure.

17. The electronic device of claim 14, wherein:
the first PCB and the second PCB are combined with each other through a ball grid array (BGA), and
the first PCB transmits a frequency signal for generating power or a radio frequency to the wireless communication chip through the second PCB.

18. The electronic device of claim 14, wherein:
the antenna module further includes a second structure disposed on the upper surface of the first PCB and surrounding the wireless communication chip and the second PCB, and
the second structure is formed of or contains a metallic material for blocking electromagnetic waves.

19. The electronic device of claim 18, wherein:
the second structure is connected to the upper surface of the first PCB through a connector, and
the second structure operates as a ground layer for the first antenna.

20. The electronic device of claim 18, wherein the antenna module further includes a thermal interface material (TIM) disposed on the inner surface of the second structure facing the wireless communication chip and coupled with the wireless communication chip.

* * * * *